METHOD OF CONTACTING A MULTISHORT-CIRCUITED EMITTER ZONE OF pnpn SEMICONDUCTOR STRUCTURE Filed Sept. 29, 1967

INVENTORS
Edouard Eugster
Dieter Spickenreuther
BY
Pierce, Scheffler & Parker
Attorneys United States Patent Office 3,506,503

Patented Apr. 14, 1970

3,506,503

METHOD OF CONTACTING A MULTISHORT-CIRCUITED EMITTER ZONE OF pnpn SEMICONDUCTOR STRUCTURE Edouard Eugster, Windisch, and Dieter Spickenreuther, Baden, Switzerland, assignors to Aktiengesellschaft Brown, Boveri & Cie, Baden, Switzerland, a joint-stock company Filed Sept. 29, 1967, Ser. No. 671,640
Claims priority, application Switzerland, Dec. 29, 1966, 18,757/66
Int. Cl. H01l 7/46
U.S. Cl. 148—179 11 Claims

ABSTRACT OF THE DISCLOSURE

A method for contacting a multishort-circuited emitter zone of a pnpn controllable semiconductor valve made from a slice of semiconductor material such as silicon comprises the step of alloying to the face of the semiconductor slice disposed towards the emitter zone a layer of metal containing doping atoms in sufficiently high concentration for a surface zone to be formed after the metallic layer has been alloyed-on to those regions of the control zone and the emitter zone which extend as far as the surface of such face. This surface zone exhibits a conduction of a type opposite to that of the emitter zone and forms together with the latter a degenerated p-n junction.

The present invention relates to the art of controllable semiconductor valves having a pnpn structure and more particularly to an improved process for contacting the emitter zone of the valve in cases where this zone is provided with a plurality of short circuits.

The originally developed controllable semiconductor elements having a pnpn structure (thyristors) exhibited the property, disadvantageous for many uses, of firing even within the cut-off region of the static characteristic curve when the anode voltage U rose rapidly (large $dU/dt$). This phenomenon is due to the fact that a rapid rise in anode voltage in order to change up the self-capacity of the cut-off p-n junction involves a brief flow of current having an action similar to that of a firing pulse. In order to correct this disadvantageous behavior, it has been proposed to provide the emitter zone with short circuits at a plurality of locations on the surface of the semiconductor (see for example the article by F. W. Gutzwiller "Thryristor Semiconductor Components Today" in IEE Transactions on Industry and General Applications, vol. Iga–1, No. 6, 1965). The short circuits, to a large extent, keep this brief charging current away from the p-n junction between the emitter and control zone, with the result that the said current cannot have nearly so much effect on the firing behavior of the thyristor. In addition, these short circuits cause an increase in the switching current, and thus an increase in the limiting temperature of the thyristor which has a decisive effect on a definite and stable switching behavior.

A known process for producing these emitter short circuits resides for example in applying graphite grains to the face of the semiconductor slice or wafer at the locations of the intended short circuits before the metal foil is alloyed-on in order to produce the emitter zone, which grains prevent alloying from taking place at these locations, where the emitter zone is thus prevented from forming.

This known process for producing the emitter zone has the disadvantage that the effective resistance of the individual short circuits is not defined, but fluctuates in production from thyristor or thyristor. This results in thyristor characteristics exhibiting a relatively wide spread within a series.

It is accordingly the object of the invention to provide a process of making contact with a semiconductor slice having emitter zone short circuits wherein this disadvantage is avoided.

The process according to the invention is characterized in that a layer of metal is applied and alloyed to at least part of the area of the face of the semiconductor slice disposed towards the emitter zone, which layer contains doping atoms in sufficiently high concentration for a surface-doped layer to be formed after the said layer of metal has been alloyed-on to those regions of the control zone and emitter zone which extend as far as the surface on the said face, which doped layer exhibits conduction of a type opposite to that of the emitter zone, and forms together with the latter a degenerated p-n junction.

The invention will be explained by way of example hereinafter with reference to the accompanying drawings wherein.

Figure 1:
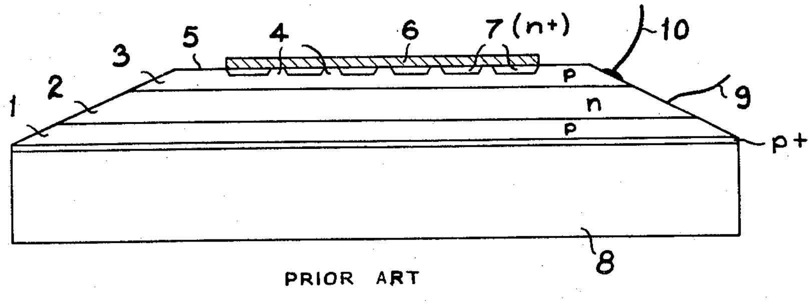
FIG. 1 is a central vertical section through a thyristor of known construction where contact is made with the short circuited emitter zone in accordance with a previously developed technique.

With reference now to the drawings and to FIG. 1 in particular, wherein the thicknesses of the several zones of the thyristor have been purposely exaggerated for the sake of clarity in illustration, in the production of the active part of the semiconductor structure, a pnp structure with layer-shaped zones 1 to 3 is produced in the conventional manner by a diffusion process from a circular silicon monocrystalline slice exhibiting conduction of the n type. Graphite grains are then applied at the locations 4 of the face 5 of the semiconductor slice adjoining the emitter zone 3, and a foil 6 of a gold-antimony alloy is alloyed-on over the said locations. At the locations of the face 5 not covered by the graphite grains, the silicon enters into a eutectic system with the alloy material while alloying is in progress, and after recrystallization the said system forms a highly doped (n+) emitter zone 7 which is short circuited at the said locations 4 by the control zone 3. Finally, and in the usual manner, the other face is soldered to a carrier plate 8, the edge surface 9 is given a conical shape, and the control connection 10 is made. However, as has been found in practice, this process does not enable the emitter short circuits to be made with a resistance well defined within narrow limits between the alloy foil 6 and the control zone 3.

Figure 2:
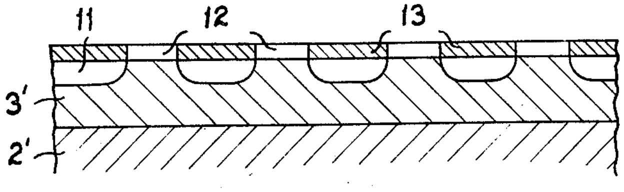
PRIOR ART Fig. 2
FIG. 2 is a partial vertical section of the same general type of thyristor illustrating a step in an improved mode of establishing contact with the short circuited emitter zone according to one embodiment of the present invention.
Figure 3:
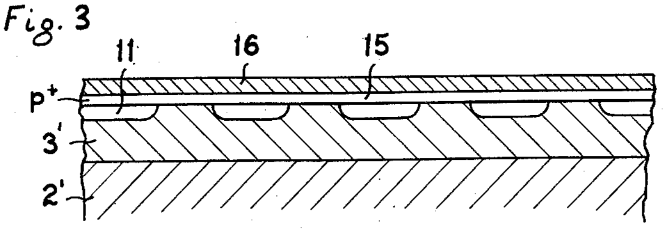
FIG. 3 is a view similar to FIG. 2 illustrating a second step in the method of the invention for contacting the emitter zone.

FIGURES 2 and 3 illustrate an example of the improved process according to the invention for making contact with a semiconductor slice having a pnpn structure and short circuits in the emitter zone when producing a thyristor whereof the emitter zone is produced by means of an alloying process.

FIGURE 2 shows a portion of the semiconductor slice after production of the emitter zone 11, which is provided with short circuits. In order to produce this emitter zone 11, a foil 13 comprising holes 12 is alloyed-on to the face of a silicon monocrystalline slice adjoining the control zone 3', which slice has a layer-type pnp structure whereof only the control zone 3' and the middle zone 2' are to be seen in FIG. 2. The foil 13 is for example 60 μm. thick and contains 1% by weight of Sb, and the holes 12 are 1 mm. in diameter, with a mutual clearance of 1.5 mm.

Alloying is carried out in vacuo at 800° C. Upon solidification, a highly doped (n+) emitter zone 11 exhibiting conduction of the n type is formed by recrystallization below the foil. The control zone reaches right up to the face of the semiconductor slice at the locations of the holes 12.

Simultaneously with this first step of alloying, it is advantageous for a carrier plate (similar to the carrier plate 8 according to FIG. 1) also to be alloyed-on to the opposite face of the semiconductor slice, this being done by means of an aluminum slice inserted between the carrier plate and the semiconductor slice.

In order to make contact with the face (see FIG. 3) a second metal foil, 20 $\mu$m. thick, made of a gold-boron alloy with 1% by weight of B is applied to the first foil 13 and alloyed-on in vacuo at 550° C., both metal foils and a surface layer of silicon on the semiconductor slice fusing to one another while forming a eutectic system. After cooling, a recrystallized highly doped (p+) zone 15 exhibiting conduction of the p type forms over the whole face of the semiconductor slice, and is thinner than the emitter zone 11 (FIG. 2) originally formed. A layer of gold 16 containing the material of both foils remains over this zone 15. The concentration of antimony and boron doping atoms in the alloyed-on foils is made sufficiently high to produce the emitter zone 11 on the one hand and the zone 15 on the other hand in the form of two zones of differing types of conduction, both being sufficiently highly doped to form with one another a so-called "degenerated" p-n junction, which is known to give to a large extent a free transfer of charge-carriers because of the tunnel effect, so that in this case there is practically a short circuit between the zone 15 and the emitter zone 11. The highly doped (p+) zone 15 exhibiting conduction of the p type and the control zone 3 exhibiting conduction of the same type together form a well defined so-called "ohmic" contact.

Apart from the short circuits at the locations of the holes 12 in the foil 13, and according to a further variant of the process, the alloyed-on second metal foil is made with a larger area than the emitter zone in order to produce additional emitter short circuits at the edge of the emitter zone, with the result that this second metal foil overlaps the emitter zone, and is directly alloyed on at its edge to the control zone.

Instead of using a single metal foil covering the emitter zone for the layer of metal to be applied and alloyed-on in the process according to the invention, this layer of metal is applied, according to another variant of the process, in the form of a plurality of foils, in each case only at the locations of the emitter short circuits.

In a further variant of the process, the layer of metal is vapor-coated on to the emitter.

In a second variant of use, the process according to the invention may also be used in the production of thyristors, an emitter zone extending over the whole face of the semiconductor slice being first of all produced by alloying on a gold foil with an antimony additive. Holes are then etched into the alloyed-on gold foil, for example, by means of a known masking method. Thereupon, the emitter zone is removed at the locations of these holes in a second etching operation while the *dU/dt* behavior and/or the switching current are continuously measured, and the etching operation is terminated when the desired values of these quantities are reached. Such a process is described in an earlier patent application, Ser. No. 664,121 filed Aug. 29, 1967, and based upon Swiss application No. 13,939 filed Sept. 27, 1966.

We claim:

1. Method for contacting a multishort-circuited emitter zone of a pnpn controllable semiconductor valve which comprises the step of applying and alloying to at least part of the area of the face of a semiconductor slice disposed towards the emitter zone a layer of metal containing doping atoms in sufficiently high concentration for a surface zone to be formed after said metallic layer has been alloyed-on to those regions of the control zone and emitter zone which extend as far as the surface on said face, said surface zone exhibiting conduction of a type opposite to that of said emitter zone and forming together with the latter a degenerated p-n junction.

2. Method as defined in claim 1 which includes the step of forming the emitter zone by alloying-on to the control zone a metallic foil containing doping atoms.

3. Method as defined in claim 2 wherein said metallic foil consists of a gold alloy with an antimony additive.

4. Method as defined in claim 2 wherein said metallic foil includes holes at the locations where short circuits are formed in the emitter zone.

5. Method as defined in claim 2 and which includes the step of etching in holes into said alloyed-on metallic foil by a masking technique for the purpose of forming the emitter zone, the emitter zone being etched away at the locations exposed by these holes.

6. Method as defined in claim 1 wherein a foil of a gold alloy with a boron additive is utilized as the layer of metal for a silicon semiconductor slice.

7. Method as defined in claim 1 wherein said alloyed-on metallic layer occupies a larger area than said emitter zone in order to produce emitter short circuits at the edge of said emitter zone.

8. Method as defined in claim 1 wherein said metallic layer is applied in the form of a plurality of foils only at the locations of the emitter short circuits.

9. Method as defined in claim 1 wherein said metallic layer is vapor-coated on.

10. Method for forming and contacting a multishort-circuited emitter zone of a pnpn controllable semiconductor valve which comprises the steps of forming the emitter zone by alloying-on to a face of the control zone of a slice of silicon semiconductor material a metallic foil containing doping atoms, said metallic foil including holes at the location where short circuits are formed in the emitter zone, said metallic foil upon solidification forming a highly doped emitter zone as a result of recrystallization below the foil, said control zone reaching up to the face of the semiconductor slice at the locations of the holes in said foil, and alloying-on to said metallic foil a second metallic foil also containing doping atoms, both of said metallic foils and a surface layer of the silicon fusing to one another while forming a eutectic system, said metallic foils after solidifying forming a recrystallized highly doped zone over the whole face of said semiconductor slice and which is covered by a layer of the second metallic foil containing doping atoms of both metallic foils, the concentration of the doping atoms in both of said metallic foils being made sufficiently high to produce the emitter zone on the one hand and the surface zone on the other hand in the form of two zones of differing types of conduction, said two zones conjointly establishing a degenerated p–n junction.

11. Method for forming and contacting a multishort-circuited emitter zone of a pnpn controllable semiconductor valve which comprises the steps of forming the emitter zone by alloying-on to a face of the control zone of a slice of silicon semiconductor material a metallic foil containing doping atoms, said metallic foil upon solidification forming a highly doped emitter zone as a result of recrystallization below the foil, applying on said metallic foil a masking layer including holes, producing holes in said metallic foil by etching away the foil material at the locations exposed by the holes in said masking layer, removing said masking layer and etching away the emitter zone at the locations exposed by the holes in said foil, said control zone reaching up to the face of the semiconductor slice at the locations of the holes in said foil, and alloying-on to said metallic foil a second metallic foil also containing doping atoms, both of said metallic foils and a surface layer of the silicon fusing to one another while forming a eutectic system, said metallic foils after solidifying forming a recrystallized highly doped zone over the whole face of said semiconductor slice and which is covered by a layer of the second metallic foil containing doping atoms of both metallic foils, the concentration of the doping atoms in both of said metallic foils being made sufficiently high to produce the emitter zone on the one hand and the surface zone on the other hand in the form of two zones of differing types of conduction, said two zones conjointly establishing a degenerated p–n junction.

References Cited

UNITED STATES PATENTS

| | | | |
|---|---|---|---|
| 3,363,308 | 1/1968 | Lueck | 148—177 |
| 3,375,143 | 3/1968 | Garner et al. | 148—177 |
| 3,384,518 | 5/1968 | Shoda et al. | 148—179 |

RICHARD O. DEAN, Primary Examiner

U.S. Cl. X.R.

148—33.1, 180, 181, 185